United States Patent
Sakaniwa et al.

(10) Patent No.: US 11,222,835 B2
(45) Date of Patent: Jan. 11, 2022

(54) INSULATING CIRCUIT SUBSTRATE AND METHOD FOR PRODUCING INSULATING CIRCUIT SUBSTRATE

(71) Applicant: MITSUBISHI MATERIALS CORPORATION, Tokyo (JP)

(72) Inventors: Yoshiaki Sakaniwa, Saitama (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/980,623

(22) PCT Filed: Mar. 1, 2019

(86) PCT No.: PCT/JP2019/008013
§ 371 (c)(1),
(2) Date: Sep. 14, 2020

(87) PCT Pub. No.: WO2019/181428
PCT Pub. Date: Sep. 26, 2019

(65) Prior Publication Data
US 2021/0020557 A1 Jan. 21, 2021

(30) Foreign Application Priority Data
Mar. 23, 2018 (JP) .............................. JP2018-056945

(51) Int. Cl.
*H01L 23/14* (2006.01)
*H01L 23/498* (2006.01)
*H01L 21/48* (2006.01)

(52) U.S. Cl.
CPC .... *H01L 23/49822* (2013.01); *H01L 21/4857* (2013.01); *H01L 23/145* (2013.01); *H01L 23/49894* (2013.01)

(58) Field of Classification Search
CPC ........... H01L 23/49822; H01L 21/4857; H01L 23/49894; H01L 23/145; H01L 23/142;
(Continued)

(56) References Cited

U.S. PATENT DOCUMENTS

2002/0038725 A1\* 4/2002 Suzuki ................ H05K 1/0373
174/262
2007/0148467 A1\* 6/2007 Lawrence .............. H05K 1/056
428/411.1
(Continued)

FOREIGN PATENT DOCUMENTS

JP S54-158469 A 12/1979
JP 2003-303940 A 10/2003
(Continued)

OTHER PUBLICATIONS

International Search Report dated May 21, 2019, issued for PCT/JP2019/008013 and English translation thereof.

*Primary Examiner* — Steven T Sawyer
(74) *Attorney, Agent, or Firm* — Locke Lord LLP; James E. Armstrong, IV; Nicholas J. DiCeglie, Jr.

(57) ABSTRACT

An insulating circuit substrate includes an insulating layer; and a circuit layer formed on one surface of the insulating layer, in which the insulating layer has a core layer formed of an epoxy resin containing an inorganic filler, and a skin layer formed on the circuit layer side of the core layer and formed of a polyimide resin containing an inorganic filler, an amount of the inorganic filler in the epoxy resin forming the core layer is in a range of 80 vol % or more and 95 vol % or less, and an amount of the inorganic filler in the polyimide resin forming the skin layer is in a range of 10 vol % or more and 30 vol % or less.

19 Claims, 6 Drawing Sheets

(58) Field of Classification Search
CPC ....... H01L 23/3735; H01L 2924/13055; H01L 2924/13091; H01L 2924/0002; H01L 23/498; H01L 2224/32225; H01L 2224/16225; H05K 1/056; H05K 2201/0195; H05K 2201/0209; H05K 3/4602; H05K 1/0271
See application file for complete search history.

(56) References Cited

U.S. PATENT DOCUMENTS

| | | | | |
|---|---|---|---|---|
| 2009/0267212 A1* | 10/2009 | Wada | ............ | H01L 23/145 257/687 |
| 2009/0302462 A1* | 12/2009 | Hosomi | ............ | B32B 27/281 257/734 |
| 2010/0044081 A1* | 2/2010 | Morimoto | ............ | B32B 15/20 174/251 |
| 2011/0120754 A1* | 5/2011 | Kondo | ............ | H01L 23/49833 174/254 |
| 2012/0067631 A1* | 3/2012 | Kusukawa | ............ | H01L 23/49894 174/258 |
| 2013/0105200 A1* | 5/2013 | Ohigashi | ............ | H05K 1/02 174/250 |
| 2013/0149514 A1* | 6/2013 | Hayashi | ............ | H01B 3/02 428/213 |
| 2013/0242520 A1* | 9/2013 | Onozuka | ............ | H01L 23/49822 361/783 |
| 2014/0290997 A1* | 10/2014 | Maeda | ............ | H05K 3/4673 174/258 |
| 2016/0035660 A1* | 2/2016 | Terasaki | ............ | C22C 13/02 174/252 |
| 2018/0016470 A1 | 1/2018 | Shinba | | |

FOREIGN PATENT DOCUMENTS

| | | |
|---|---|---|
| JP | 2006-210597 A | 8/2006 |
| JP | 2016-004925 A | 1/2016 |
| JP | 2017-203132 A | 11/2017 |
| WO | 2016/158268 A1 | 10/2016 |

* cited by examiner

INSULATING CIRCUIT SUBSTRATE AND METHOD FOR PRODUCING INSULATING CIRCUIT SUBSTRATE

TECHNICAL FIELD

The present invention relates to an insulating circuit substrate provided with an insulating layer and a circuit layer formed on one surface of the insulating layer, and a method for manufacturing an insulating circuit substrate.

Priority is claimed on Japanese Patent Application No. 2018-056945, filed Mar. 23, 2018, the content of which is incorporated herein by reference.

BACKGROUND ART

Power modules, LED modules, and thermoelectric modules have structures in which a power semiconductor element, an LED element, and a thermoelectric element are respectively bonded to an insulating circuit substrate in which a circuit layer formed of a conductive material is formed on one surface of an insulating layer.

For example, Patent Document 1 proposes an insulating circuit substrate used for a semiconductor device. In addition, Patent Document 2 proposes an insulating sheet which forms an insulating layer.

The insulating circuit substrate disclosed in Patent Document 1 has a structure in which a second metal plate formed in an electric circuit pattern is laminated on a first metal plate via two resin layers, and the first resin layer in contact with the first metal plate is a resin layer having a thickness of 20 µm or more filled with 50% by weight or more of a filler of 20 W/(m·K) or more, and the second resin layer in contact with the second metal plate is a resin layer having a thickness of 5 µm or less in which the filling ratio of the filler is 10% by weight or more smaller than the filling ratio of the filler of the first resin layer.

In addition, the insulating sheet disclosed in Patent Document 2 has a configuration in which a filling member is filled in an adhesive component with a thermosetting resin as a main component, the filling ratio of the filling member in an adhesive surface region is less than the filling ratio of the filling member in an internal region, and the thermal conductivity of the adhesive surface region and the internal region is adjusted according to the filling ratio of the filling member in each region.

CITATION LIST

Patent Literature

[Patent Document 1]
Japanese Unexamined Patent Application, First Publication No. 2003-303940
[Patent Document 2]
Japanese Unexamined Patent Application, First Publication No. 2006-210597

SUMMARY OF INVENTION

Technical Problem

In Patent Document 1, as described in paragraph 0027, the first resin layer and the second resin layer are formed of an epoxy resin. In addition, Patent Document 2 also gives an epoxy resin as an example of a thermosetting resin, as described in paragraph 0013.

In the epoxy resin described above, it is possible to contain a large amount of filler and to improve the thermal conduction property, thus, it is possible to efficiently dissipate heat generated in an element mounted on the circuit layer.

However, in a case where the epoxy resin contains a large amount of filler, the bonding property with respect to metal plates is reduced, and there is a concern that, when a heat treatment such as a reflow treatment is performed, the circuit layer formed of the metal plate and the insulating layer formed of the epoxy resin may be peeled.

Examples of a thermosetting resin forming an insulating layer include a polyimide resin. This polyimide resin has a good bonding property with respect to metal plates and suppresses peeling of the circuit layer formed of the metal plate and the insulating layer formed of the polyimide resin even when a heat treatment such as a reflow treatment is performed.

However, since it was not possible for the polyimide resin to include a large amount of filler and the thermal conduction property was low, it was not possible to efficiently dissipate heat generated in the element mounted on the circuit layer.

As described above, in Patent Documents 1 and 2, even in a case where an epoxy resin or a polyimide resin is used as the thermosetting resin, it was not possible to form an insulating circuit substrate having excellent bonding reliability and excellent heat dissipation characteristics.

The present invention was made in view of the circumstances described above and has an object of providing an insulating circuit substrate having excellent bonding reliability and excellent heat dissipation characteristics, and a method for manufacturing an insulating circuit substrate.

Solution to Problem

In order to achieve the aforementioned objects, an insulating circuit substrate of the present invention is an insulating circuit substrate including an insulating layer, and a circuit layer formed on one surface of the insulating layer, in which the insulating layer has a core layer formed of an epoxy resin containing an inorganic filler, and a skin layer formed of a polyimide resin containing an inorganic filler and formed on the circuit layer side of the core layer, an amount of the inorganic filler in the epoxy resin forming the core layer is in a range of 80 vol % or more and 95 vol % or less, and an amount of the inorganic filler in the polyimide resin forming the skin layer is in a range of 10 vol % or more and 30 vol % or less.

According to the insulating circuit substrate with this configuration, since the insulating layer has a core layer formed of an epoxy resin containing an inorganic filler, and a skin layer formed of a polyimide resin containing an inorganic filler and formed on the circuit layer side of the core layer, the circuit layer and the skin layer formed of polyimide resin are bonded and the bonding reliability between the insulating layer and the circuit layer is excellent.

Since the amount of the inorganic filler in the epoxy resin forming the core layer is in a range of 80 vol % or more and 95 vol % or less, the core layer has excellent thermal conduction property and it is possible to efficiently dissipate heat generated in the element mounted on the circuit layer.

Since the amount of the inorganic filler in the polyimide resin forming the skin layer is 10 vol % or more, it is possible to improve the thermal conduction property in the skin layer. On the other hand, since the amount of the inorganic filler in the polyimide resin is 30 vol % or less, it is possible to sufficiently ensure the bonding reliability between the circuit layer and the skin layer.

In the insulating circuit substrate of the present invention, a metal layer may be formed on a surface of the insulating layer on an opposite side to the circuit layer, and a skin layer formed of a polyimide resin containing an inorganic filler may be formed on the metal layer side of the core layer.

In this case, the metal layer formed on the surface of the insulating layer on an opposite side to the circuit layer makes it possible to efficiently dissipate the heat on the circuit layer side. In addition, since a skin layer formed of a polyimide resin is formed on the metal layer side of the core layer, the bonding reliability between the metal layer and the insulating layer is excellent.

A method for manufacturing an insulating circuit substrate of the present invention is a method by which the insulating circuit substrate described above is manufactured, the method including a core layer forming step of forming a core layer by curing an epoxy resin composition including an inorganic filler and an epoxy resin, a polyimide resin composition providing step of providing a polyimide resin composition including an inorganic filler and a polyimide resin on a surface of the core layer, a metal plate laminating step of laminating a metal plate to be a circuit layer on the polyimide resin composition, and a thermocompression bonding step of pressing and heating the metal plate, the polyimide resin composition, and the core layer in a laminating direction, curing the polyimide resin composition to form the skin layer, and bonding the metal plate and the insulating layer to form the circuit layer.

As described above, since the method for manufacturing an insulating circuit substrate having this configuration is provided with a core layer forming step, a polyimide resin composition providing step, a metal plate laminating step, and a thermocompression bonding step, it is possible to form an insulating layer having a core layer formed of an epoxy resin and a skin layer formed of a polyimide resin and to form a circuit layer by bonding this skin layer and a metal plate. In this manner, since the skin layer formed of the polyimide resin and the metal plate are bonded, the bonding reliability between the insulating layer and the circuit layer is excellent. Furthermore, since the core layer is formed by curing an epoxy resin containing an inorganic filler, the insulating layer has excellent thermal conduction property.

In addition, a method for manufacturing an insulating circuit substrate of the present invention is a method for manufacturing an insulating circuit substrate by which the insulating circuit substrate described above is manufactured including a polyimide resin composition providing step of providing a polyimide resin composition including an inorganic filler and the polyimide resin, on a metal plate to be the circuit layer, an epoxy resin composition laminating step of laminating an epoxy resin composition including an inorganic filler and an epoxy resin on the polyimide resin composition, and a thermocompression bonding step of pressing and heating the metal plate, the polyimide resin composition, and the epoxy resin composition in a laminating direction, curing the polyimide resin composition to form a skin layer, curing the epoxy resin composition to form the core layer, and bonding the metal plate and the insulating layer to form the circuit layer.

As described above, since the method for manufacturing an insulating circuit substrate with this configuration is provided with the polyimide resin composition providing step, the epoxy resin composition laminating step, and the thermocompression bonding step, it is possible to form an insulating layer having a core layer formed of an epoxy resin and a skin layer formed of a polyimide resin and to form a circuit layer by bonding this skin layer and a metal plate. In this manner, since the skin layer formed of the polyimide resin and the metal plate are bonded, the bonding reliability between the insulating layer and the circuit layer is excellent. Furthermore, since the core layer is formed by curing an epoxy resin containing an inorganic filler, the insulating layer has excellent thermal conduction property.

The method for manufacturing an insulating circuit substrate described above may further include a circuit pattern forming step of forming a circuit pattern by etching the metal plate to be the circuit layer after the thermocompression bonding step.

In this case, it is possible to form a circuit pattern on a circuit layer by performing an etching treatment after bonding the metal plate.

Alternatively, in the method for manufacturing an insulating circuit substrate described above, by using a plurality of metal pieces provided in a circuit pattern as the metal plate, the thermocompression bonding step may have a configuration in which a pressing member is disposed in a region, in which the metal pieces are not provided, and pressed.

In this case, it is possible to form a circuit pattern by bonding a plurality of metal pieces provided in a circuit pattern. Since the thermocompression bonding step is configured such that a pressing member is disposed in a region where the metal pieces are not provided and pressed, it is possible to sufficiently press the entire resin composition in the thermocompression bonding step and to uniformly cure the resin composition.

Advantageous Effects of Invention

According to the present invention, it is possible to provide an insulating circuit substrate having excellent bonding reliability and excellent heat dissipation characteristics, and a method for manufacturing this insulating circuit substrate.

DESCRIPTION OF EMBODIMENTS

A description will be given below of embodiments of the present invention with reference to the accompanying drawings.

Figure 1:
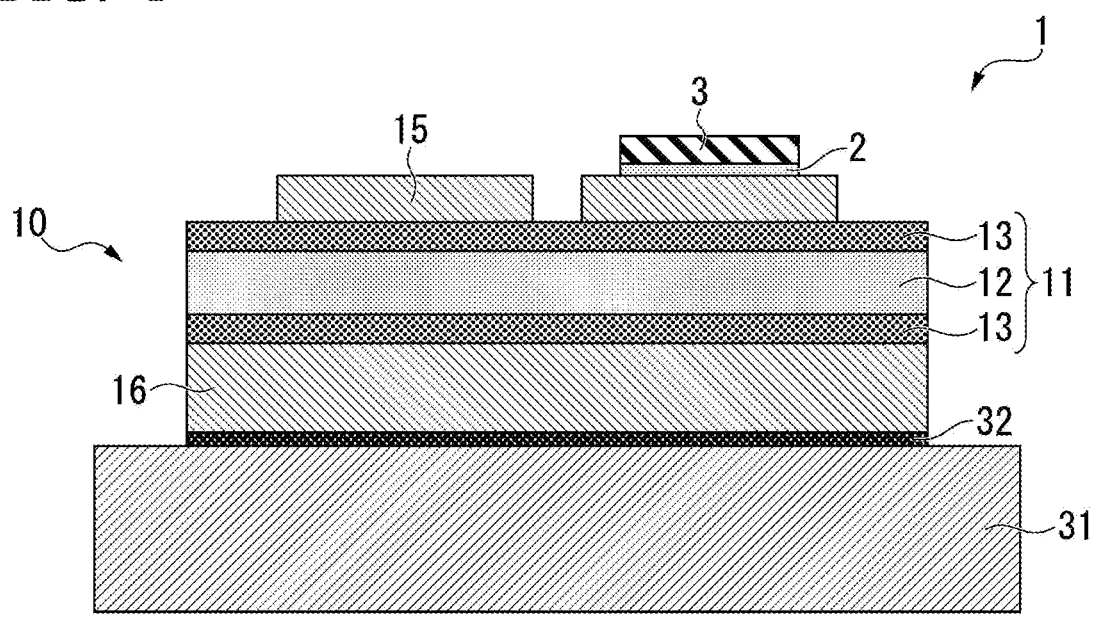
FIG. 1 is a schematic explanatory view of a power module provided with an insulating circuit substrate according to an embodiment of the present invention.

FIG. 1 shows an insulating circuit substrate 10 of an embodiment of the present invention and a power module 1 using the insulating circuit substrate 10.

The power module 1 shown in FIG. 1 is provided with the insulating circuit substrate 10, a semiconductor element 3 bonded to one surface (the upper surface in FIG. 1) of the insulating circuit substrate 10 via a first solder layer 2, and a heat sink 31 bonded to the other side (lower side in FIG. 1) of the insulating circuit substrate 10 via a solder layer 32.

The semiconductor element 3 is formed of a semiconductor material such as Si. The first solder layer 2 for bonding the insulating circuit substrate 10 and the semiconductor element 3 is made of, for example, a Sn—Ag-based, Sn—Cu-based, Sn—In-based, or Sn—Ag—Cu-based solder material (a so-called lead-free solder material).

The heat sink 31 is for dissipating heat on the insulating circuit substrate 10 side. The heat sink 31 is formed of copper or a copper alloy, aluminum, an aluminum alloy, or the like having good thermal conduction property. In the present embodiment, the heat sink is a heat dissipating plate formed of oxygen-free copper. The thickness of the heat sink 31 is set in a range of 3 mm or more and 10 mm or less.

The insulating circuit substrate 10 and the heat sink 31 are bonded via the solder layer 32. It is possible for this solder layer 32 to have the same configuration as the solder layer 2 described above.

Figure 2:
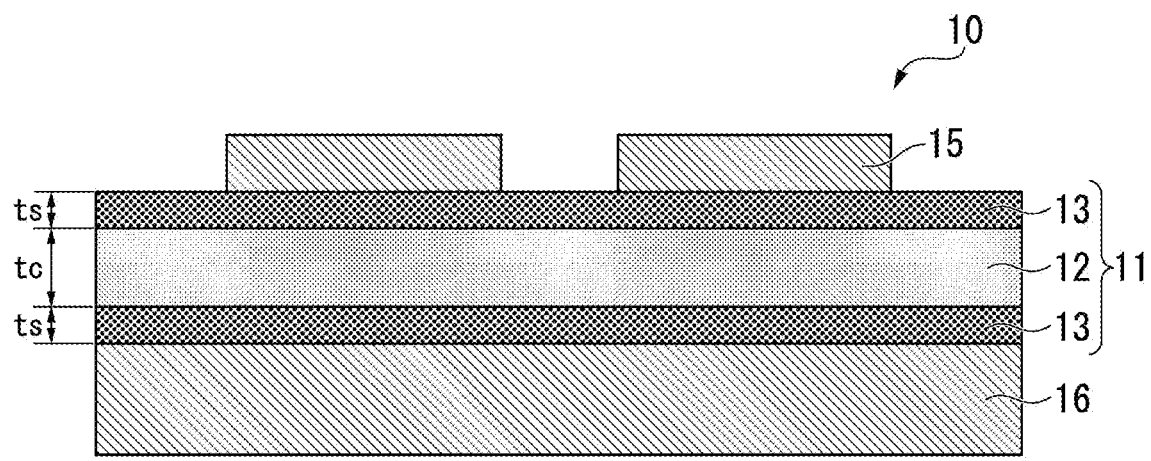
FIG. 2 is a schematic explanatory view of an insulating circuit substrate according to an embodiment of the present invention.

As shown in FIG. 2, the insulating circuit substrate 10 of the present embodiment is provided with an insulating layer 11, a circuit layer 15 provided on one surface (the upper surface in FIG. 1) of the insulating layer 11, and a metal layer 16 provided on the other surface (the lower surface in FIG. 1) of the insulating layer 11.

Figure 4:
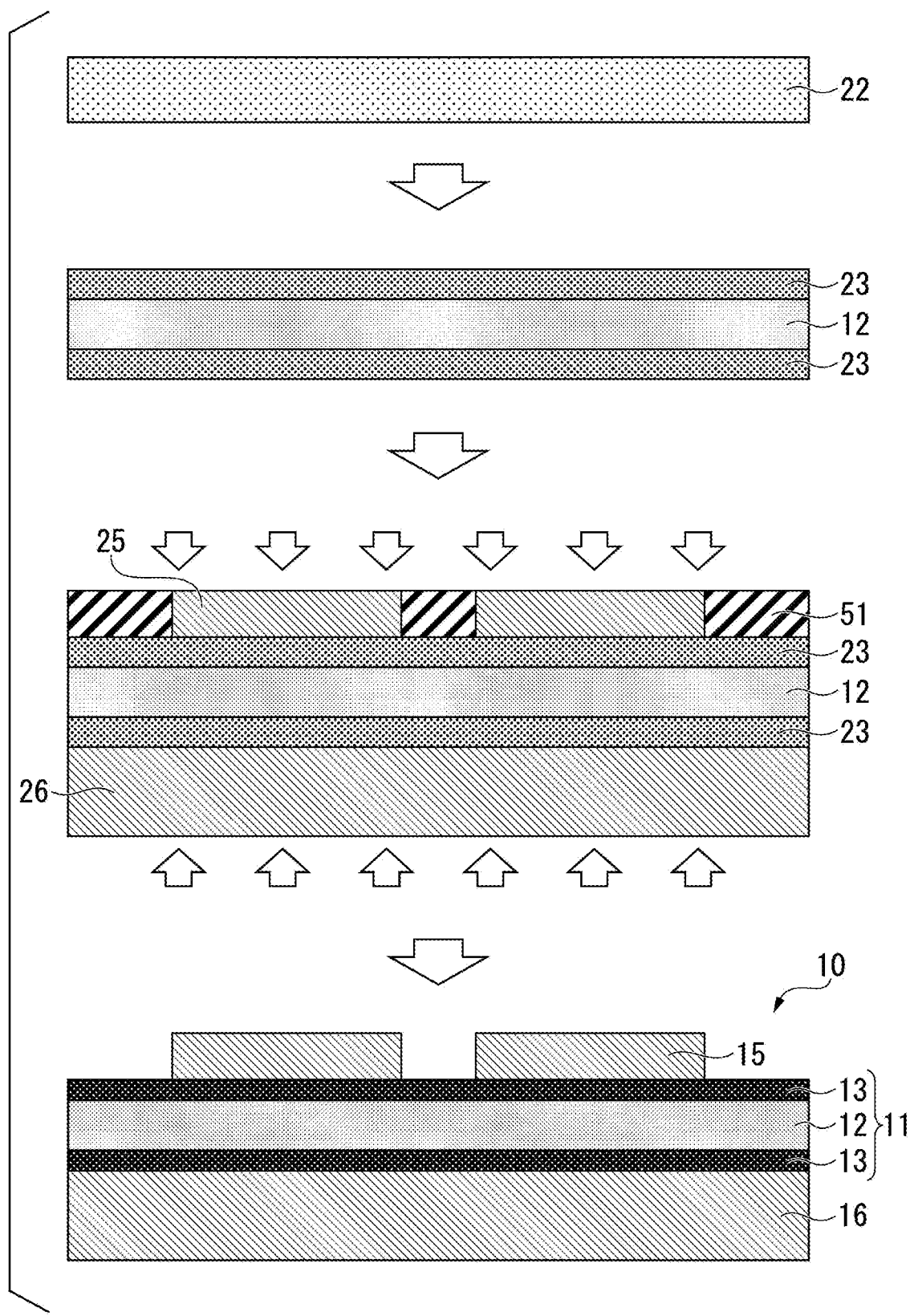
FIG. 4 is a schematic explanatory view of the method for manufacturing an insulating circuit substrate shown in FIG. 3.

As shown in FIG. 4, the circuit layer 15 is formed by bonding a metal piece 25 formed of a metal having excellent conductivity to one surface (the upper surface in FIG. 4) of the insulating layer 11. As the metal piece 25, it is possible to use a punched rolled plate of copper, a copper alloy, aluminum, an aluminum alloy, or the like. In the present embodiment, as the metal piece 25 forming the circuit layer 15, it is possible to use a punched rolled plate of oxygen-free copper.

In the circuit layer 15, a circuit pattern is formed by arranging the metal pieces 25 described above in a pattern and one surface thereof (the upper surface in FIG. 1 and FIG. 2) is a mounting surface on which the semiconductor element 3 is mounted. The thickness of the circuit layer 15 (metal piece 25) is set in a range of 0.3 mm or more and 3 mm or less and is set to 0.5 mm in the present embodiment.

As shown in FIG. 4, the metal layer 16 is formed by bonding a metal plate 26 formed of a metal having excellent thermal conduction property to the other surface (the lower surface in FIG. 4) of the insulating layer 11. As the metal plate 26, it is possible to use a rolled plate of copper, a copper alloy, aluminum, an aluminum alloy, or the like. In the present embodiment, a rolled plate of oxygen-free copper is used as the metal plate 26 forming the metal layer 16.

The thickness of the metal layer 16 (metal plate 26) is set in a range of 0.3 mm or more and 3 mm or less and is set to 2.0 mm in the present embodiment.

The insulating layer 11 prevents electrical connection between the circuit layer 15 and the metal layer 16 and is formed of a thermosetting resin having an insulating property. The insulating layer 11 is provided with a core layer 12, and skin layers 13 formed on one surface and the other surface of the core layer 12, respectively.

The core layer 12 is formed of an epoxy resin containing an inorganic filler. As the inorganic filler, it is possible to use, for example, alumina ($Al_2O_3$), boron nitride (BN), aluminum nitride (AlN), or the like. In the present embodiment, boron nitride (BN) is used as the inorganic filler.

The amount of the inorganic filler in the epoxy resin forming the core layer 12 is in a range of 80 vol % or more and 95 vol % or less.

The skin layer 13 is formed of a polyimide resin containing an inorganic filler.

As the inorganic filler, it is possible to use, for example, alumina ($Al_2O_3$), boron nitride (BN), aluminum nitride (AlN), or the like. In the present embodiment, boron nitride (BN) is used as the inorganic filler.

The amount of the inorganic filler in the polyimide resin forming the skin layer 13 is in a range of 10 vol % or more and 30 vol % or less.

In the insulating circuit substrate 10 of the present embodiment, as described above, a description will be given of the reasons why the amount of the inorganic filler in the epoxy resin forming the core layer 12, the amount of the inorganic filler in the polyimide resin forming the skin layer 13, and the ratio ts/tc between a thickness ts of the skin layer 13 and a thickness tc of the core layer 12 are defined as described above.

(Amount of Inorganic Filler in Epoxy Resin Forming Core Layer 12)

It is possible for epoxy resin to contain a relatively large amount of inorganic filler and to improve the thermal conduction property. On the other hand, in a case where an inorganic filler is contained, the insulating property decreases.

Setting the amount of the inorganic filler in the epoxy resin forming the core layer 12 to 80 vol % or more makes it possible to improve the thermal conduction property of the core layer 12. On the other hand, setting the amount of the inorganic filler in the epoxy resin forming the core layer 12 to 95 vol % or less makes it possible to suppress a decrease in the insulating property.

Therefore, in the present embodiment, the amount of the inorganic filler in the epoxy resin forming the core layer 12 is set in a range of 80 vol % or more and 95 vol % or less.

In order to further improve the thermal conduction property of the core layer 12, the lower limit of the amount of the inorganic filler in the epoxy resin forming the core layer 12 is preferably set to 85 vol % or more. In addition, in order to further suppress a decrease in the insulating property, the upper limit of the amount of the inorganic filler in the epoxy resin forming the core layer 12 is preferably set to 90 vol % or less.

(Amount of Inorganic Filler in Polyimide Resin Forming Skin Layer 13)

Polyimide resin is inferior to epoxy resin in that it is not possible to include much inorganic filler therein and the thermal conduction property is inferior; however, the bonding property with respect to metal plates is excellent.

Setting the amount of the inorganic filler in the polyimide resin forming the skin layer 13 to 10 vol % or more makes it possible to improve the thermal conduction property of the skin layer 13. On the other hand, setting the amount of the inorganic filler in the polyimide resin forming the skin layer 13 to 30 vol % or less makes it possible to suppress a decrease in the bonding property with respect to metal plates.

Therefore, in the present embodiment, the amount of the inorganic filler in the polyimide resin forming the skin layer 13 is set in a range of 10 vol % or more and 30 vol % or less.

In order to further improve the thermal conduction property of the skin layer 13, the lower limit of the amount of the inorganic filler in the polyimide resin forming the skin layer 13 is preferably set to 20 vol % or more. In addition, in order to further suppress a decrease in the bonding property, the upper limit of the amount of the inorganic filler in the polyimide resin forming the skin layer 13 is preferably 25 vol % or less.

Next, a description will be given of a method for manufacturing the insulating circuit substrate 10 according to the present embodiment with reference to FIG. 3 and FIG. 4.

(Core Layer Forming Step S01)

Figure 3:
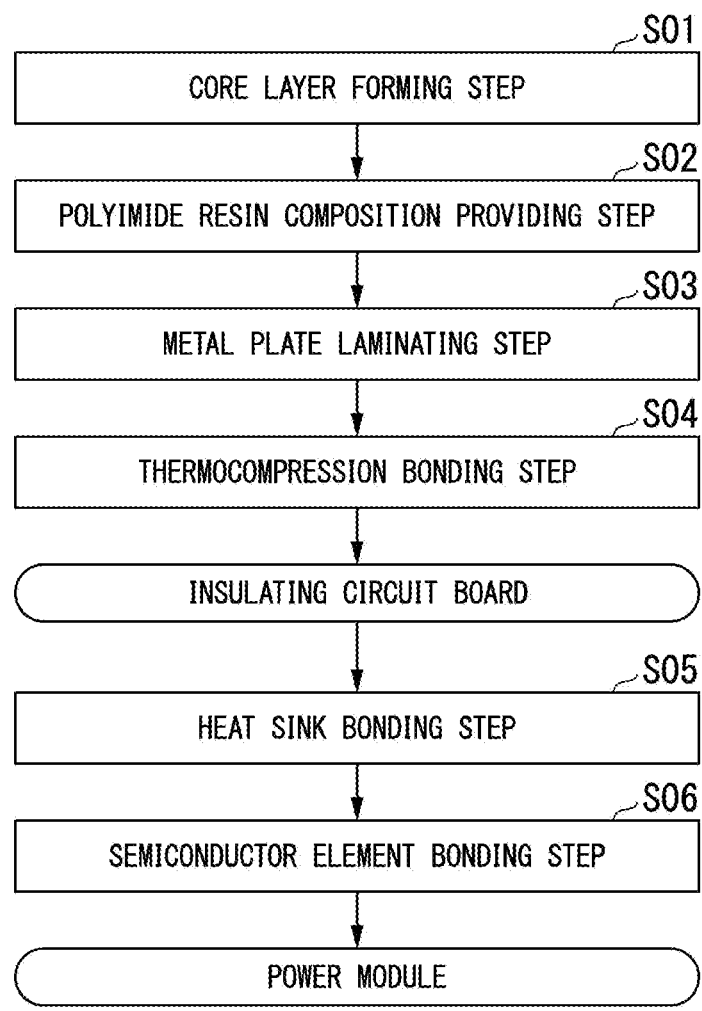
FIG. 3 is a flowchart showing a method for manufacturing an insulating circuit substrate according to an embodiment of the present invention.

First, as shown in FIG. 3 and FIG. 4, an epoxy resin composition 22 including an inorganic filler and an epoxy resin is heated and cured to form a core layer 12.

The heating temperature in the core layer forming step S01 is preferably in a range of 170° C. or higher and 200° C. or lower, and the holding time at the heating temperature is preferably in a range of 30 minutes or more and 180 minutes or less.

(Polyimide Resin Composition Providing Step S02)

Next, as shown in FIG. 3 and FIG. 4, a polyimide resin composition 23 including an inorganic filler and a polyimide resin is provided on one surface and the other surface of the core layer 12. At this time, with the polyimide resin composition 23, it is possible to suitably use a known coating means such as dip coating and spin coating.

The conditions of the polyimide resin composition providing step S02 are preferably such that the heating temperature is in a range of 180° C. or higher and 250° C. or lower and the holding time at the heating temperature is in a range of 10 min or more and 60 min or less.

The coating thickness of the polyimide resin composition 23 is preferably in a range of 0.003 mm or more and 0.005 mm or less.

(Metal Plate Laminating Step S03)

Next, metal pieces 25 to be the circuit layer 15 are laminated on the polyimide resin composition 23 provided on one surface of the core layer 12, and a metal plate 26 to be the metal layer 16 is laminated on the polyimide resin composition 23 provided on the other surface of the core layer 12.

In addition, pressing members 51 are provided in regions where the metal pieces 25 to be the circuit layer 15 are not provided. As the pressing members 51, it is possible to use members formed of polytetrafluoroethylene (PTFE), perfluoroalkoxy fluororesin (PFA), polyetherimide (PEI), or the like.

(Thermocompression Bonding Step S04)

Next, the laminated metal pieces 25 and the pressing members 51, the polyimide resin composition 23, the core layer 12, the polyimide resin composition 23, and the metal plate 26 are pressed in the laminating direction and pressed, the polyimide resin composition 23 is cured to form the skin layer 13. In addition, the circuit layer 15 is formed by bonding the polyimide resin composition 23 (skin layer 13) and the metal pieces 25, while the metal layer 16 is formed by bonding the polyimide resin composition 23 (skin layer 13) and the metal plate 26. Further, the insulating layer 11 is formed by bonding the core layer 12 and the skin layers 13.

The conditions of the thermocompression bonding step S04 are preferably such that the heating temperature is in a range of 200° C. or higher and 300° C. or lower and the holding time at the heating temperature is in a range of 30 min or more and 60 min or less.

The pressing members 51 formed of trafluoroethylene (PTFE), perfluoroalkoxy fluororesin (PFA), polyetherimide (PEI) or the like are not adhered even when the polyimide resin composition 23 is cured and are able to be easily removed after the thermocompression bonding step S04.

As described above, the insulating circuit substrate 10 of the present embodiment is manufactured.

(Heat Sink Bonding Step S05)

Next, the metal layer 16 and the heat sink 31 are laminated via a solder material and solder-bonded in a reduction furnace.

(Semiconductor Element Bonding Step S06)

Next, the semiconductor element 3 is laminated on the circuit layer 15 via a solder material and solder-bonded in a reduction furnace.

The power module 1 of the present embodiment is manufactured as described above.

According to the insulating circuit substrate 10 according to the present embodiment having the configuration described above, the insulating layer 11 has the core layer 12 formed of the epoxy resin containing the inorganic filler, and skin layers 13 formed on one surface and the other surface of the core layer 12 and formed of a polyimide resin containing an inorganic filler, thus, the metal pieces 25 to be the circuit layer 15 and the skin layer 13 formed of the polyimide resin are bonded, while the metal plate 26 to be the metal layer 16 and the skin layer 13 formed of a polyimide resin are bonded, such that the bonding reliability between the insulating layer 11 and the circuit layer 15 and between the insulating layer 11 and the metal layer 16 is excellent.

Since the amount of the inorganic filler in the epoxy resin forming the core layer 12 is in a range of 80 vol % or more and 95 vol % or less, the thermal conduction property in the core layer 12 is excellent and it is possible to efficiently dissipate heat from the semiconductor element 3 mounted on the circuit layer 15 to the heat sink 31 side.

Since the amount of the inorganic filler in the polyimide resin forming the skin layers 13 is in a range of 10 vol % or more and 30 vol % or less, even the skin layers 13 have excellent thermal conduction property.

In the present embodiment, since the metal layer 16 is formed on the surface of the insulating layer 11 on an opposite side to the circuit layer 15, it is possible to efficiently dissipate heat from the semiconductor element 3 mounted on the circuit layer 15, through the metal layer 16. In addition, since the skin layer 13 formed of a polyimide resin is formed on the metal layer 16 side of the core layer 12, the bonding reliability between the metal layer 16 and the insulating layer 11 is excellent.

According to the method for manufacturing an insulating circuit substrate according to the present embodiment, since the core layer forming step S01, the polyimide resin composition providing step S02, the metal plate laminating step S03, and the thermocompression bonding step S04 are provided, it is possible to form the insulating layer 11 having the core layer 12 and the skin layers 13, to form the circuit layer 15 by bonding the skin layer 13 and the metal pieces 25, and to form the metal layer 16 by bonding the skin layer 13 and the metal plate 26. Thus, since the skin layers 13 formed of the polyimide resin are bonded to the metal pieces 25 and the metal plate 26, the bonding reliability between the insulating layer 11, the circuit layer 15, and the metal layer 16 is excellent. Further, since the core layer 12 is formed by curing an epoxy resin containing an inorganic filler, the insulating layer 11 has excellent thermal conduction property.

In the present embodiment, when forming the circuit layer 15, a plurality of the metal pieces 25 of the plurality of the metal pieces provided in a circuit pattern are used and the thermocompression bonding step S04 is configured such that the pressing members 51 are disposed in regions, where the metal pieces 25 are not provided, and pressed, thus, it is possible to sufficiently press the entire surface of the polyimide resin composition 23 in the thermocompression bonding step S04 and uniform curing is possible. In addition, it is possible to form the circuit layer 15 having a circuit pattern.

Although the embodiments of the present invention were described above, the present invention is not limited thereto and is able to be appropriately changed in a range not departing from the technical idea of the present invention.

In the present embodiment, the description was given of the insulating circuit substrate being manufactured by the method for manufacturing an insulating circuit substrate shown in FIG. 3 and FIG. 4; however, the method is not limited thereto.

Figure 5:
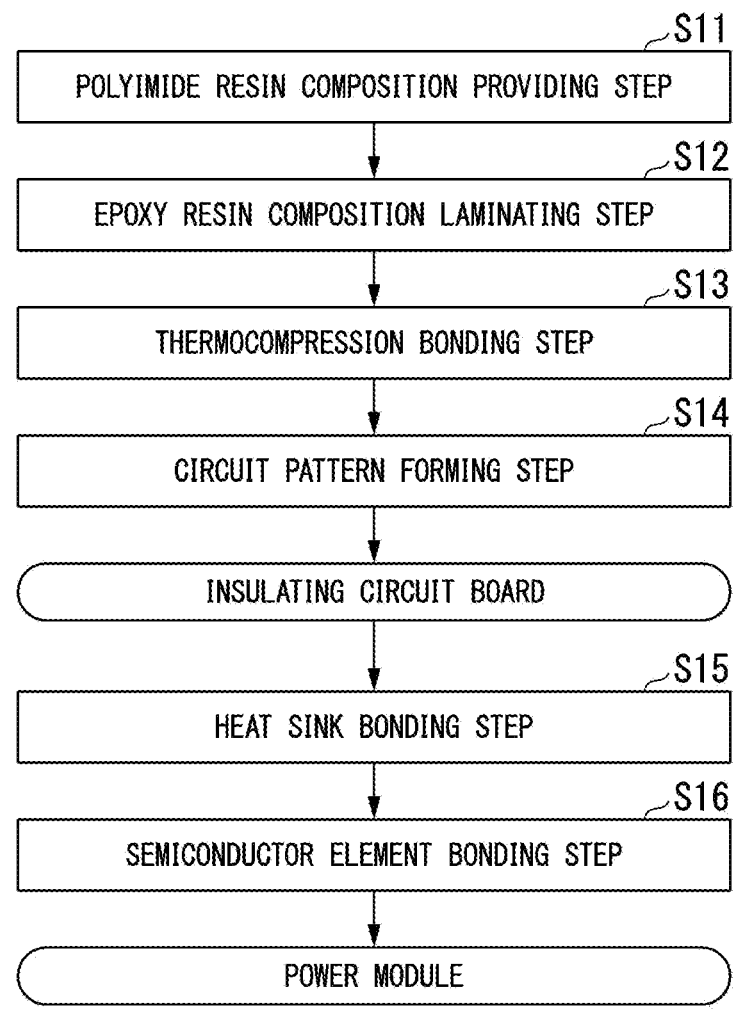
FIG. 5 is a flowchart showing a method for manufacturing an insulating circuit substrate according to another embodiment of the present invention.
Figure 6:
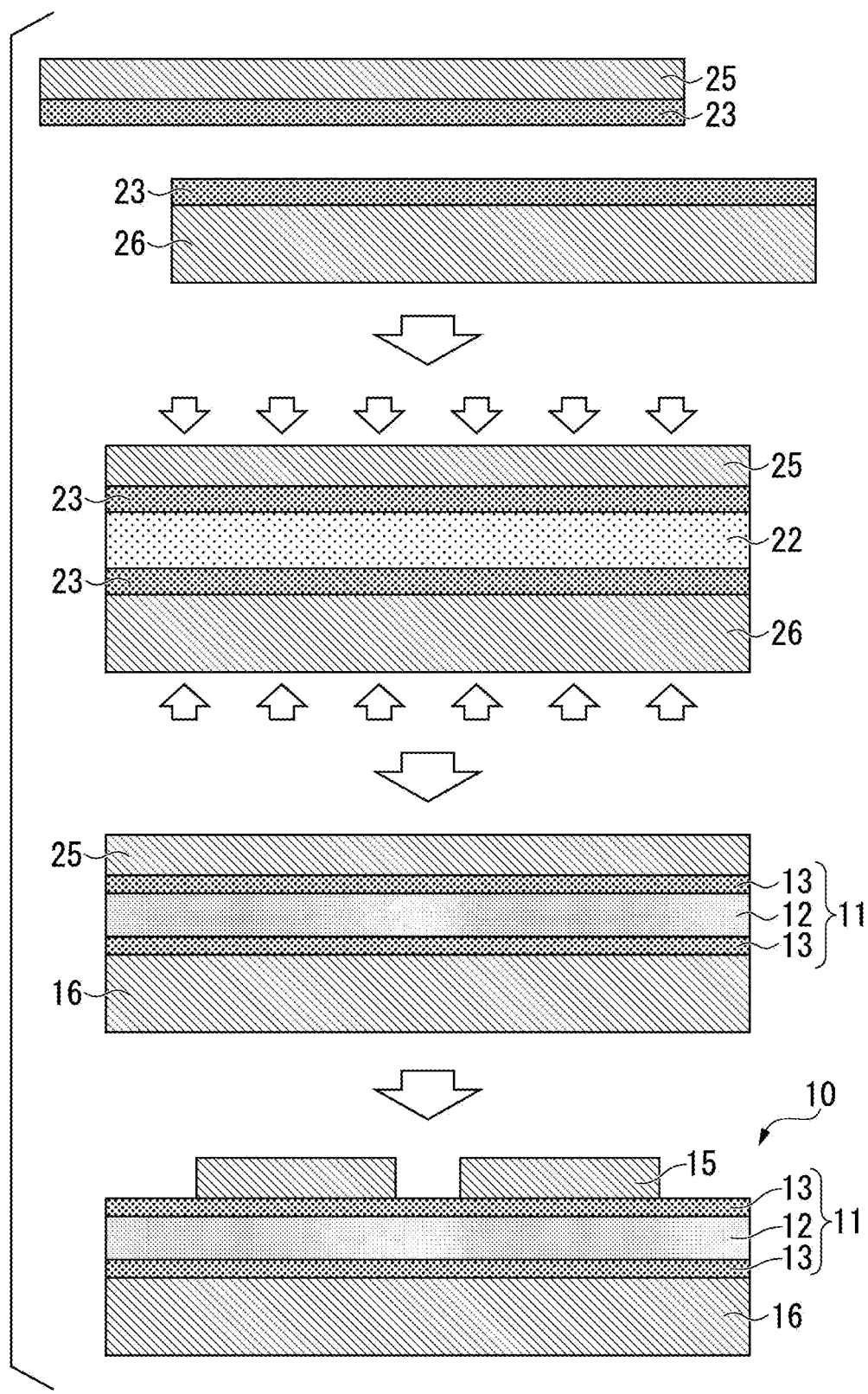
FIG. 6 is a schematic explanatory view of a method for manufacturing the insulating circuit substrate shown in FIG. 5.

For example, as shown in FIG. 5 and FIG. 6, it is possible to apply a manufacturing method which is provided with a polyimide resin composition providing step S11 of providing the polyimide resin composition 23 including an inorganic filler and a polyimide resin with respect to a metal plate 25 to be the circuit layer 15 and the metal plate 26 to be the metal layer 16, an epoxy resin composition laminating step S12 of laminating the epoxy resin composition 22 containing an inorganic filler and an epoxy resin with respect to the polyimide resin composition 23 provided on the metal plates 25 and 26, a thermocompression bonding step S13 of pressing, in the laminating direction, the metal plate 25 on which the polyimide resin composition 23 is provided and the metal plate 26 on which the epoxy resin composition 22 and the polyimide resin composition 23 are provided, heating the same so as to cure the polyimide resin composition 23 to form the skin layer 13 and to cure curing the epoxy resin composition 22 to form the core layer 12, and bonding the metal plate 25, the skin layer 13, the core layer 12, the skin layer 13, and the metal plate 26, and a circuit pattern forming step S14 of forming a circuit pattern by subjecting the bonded metal plate 25 to an etching treatment.

Even in this case, it is possible to form the insulating layer 11 having the core layer 12 and the skin layers 13. In addition, bonding the skin layers 13 formed of polyimide resin and the metal plates 25 and 26 makes it possible to improve the bonding reliability between the circuit layer 15 and the metal layer 16 and the insulating layer 11.

Furthermore, since there is a circuit pattern forming step S14 for forming a circuit pattern by subjecting the bonded metal plate 25 to an etching treatment after bonding, it is possible to form the circuit layer 15 having a circuit pattern.

The method for manufacturing an insulating circuit substrate shown in FIG. 3 and FIG. 4 may be provided with a circuit pattern forming step in which the metal plate 25 forming the circuit layer 15 is thermocompression-bonded and, after the thermocompression bonding step S04, the metal plate 25 is subjected to an etching treatment to form a circuit pattern.

Figure 7:
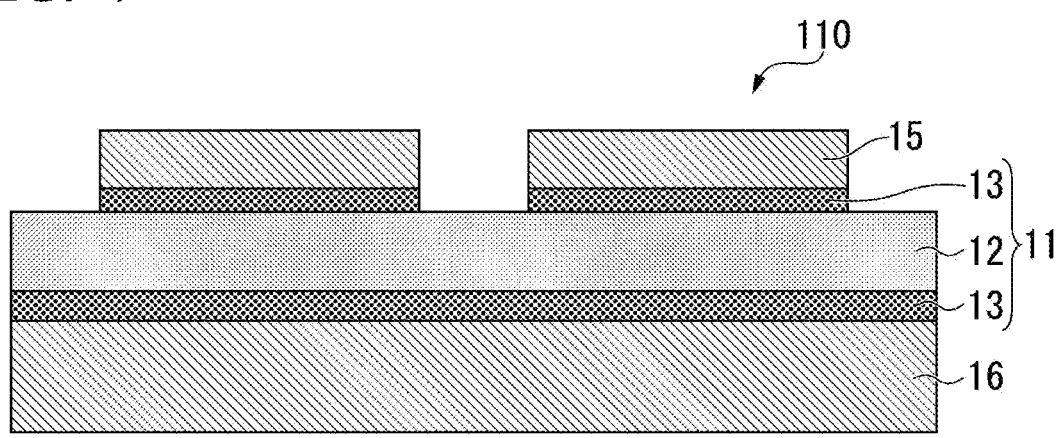
FIG. 7 is a schematic explanatory view of an insulating circuit substrate according to another embodiment of the present invention.

In the method for manufacturing an insulating circuit substrate shown in FIG. 5 and FIG. 6, the circuit pattern forming step S14 described above may be omitted by using a plurality of metal pieces arrayed in a circuit pattern as metal plates forming a circuit layer. In this case, as in an insulating circuit substrate 110 shown in FIG. 7, the skin layer 13 is formed only in the portion where the circuit layer 15 is provided.

In the present embodiment, the metal pieces and the metal plate were described as being formed of copper or a copper alloy, but may be formed of another metal such as aluminum or an aluminum alloy, without being limited thereto. In addition, a structure in which a plurality of metals are laminated may be used.

In the present embodiment, a description was given of a semiconductor element being mounted on the insulating circuit substrate to form a power module, but the present invention is not limited thereto. For example, an LED element may be mounted on a circuit layer of an insulating circuit substrate to form an LED module, or a thermoelectric element may be mounted on a circuit layer of an insulating circuit substrate to form a thermoelectric module.

EXAMPLES

A description will be given below of the results of confirmation experiments performed to confirm the effects of the present invention.

As a metal plate to be a circuit layer, a metal plate which was 27 mm×18 mm×0.035 mm in thickness was prepared. In addition, as a metal plate to be a metal layer, a metal plate which was 30 mm×21 mm×1.0 mm in thickness was prepared.

Then, an insulating layer was formed using the resin composition shown in Table 1 and a metal plate was bonded thereto to form a circuit layer and a metal layer and to manufacture an insulating circuit substrate. Invention Examples 1 to 4 and Comparative Examples 3 to 7 were manufactured by the manufacturing method shown in FIG. 3 and FIG. 4. In addition, in Comparative Examples 1 and 2, since no skin layers were formed, the metal plate was thermocompression-bonded when the core layer was heated and cured.

In Table 1, in a case where $Al_2O_3$ and BN were included as inorganic fillers, these were contained in a ratio of $Al_2O_3$:BN=2:7 (mass ratio). In addition, the amount of the inorganic filler in Table 1 was the total amount of $Al_2O_3$ and BN.

With respect to the insulating circuit substrates obtained in this manner, the presence or absence of peeling after a reflow treatment, the thermal conductivity of the insulating layer (core layer and skin layers), and the thermal resistance of the insulating circuit substrate were evaluated as follows.
(Presence or Absence of Peeling After Reflow Treatment)

The insulating circuit substrate was subjected to a reflow treatment at 290° C.×5 min. Thereafter, the presence or absence of peeling between the circuit layer and the insulating layer and between the metal layer and the insulating layer was confirmed. Table 1 shows the evaluation results.
(Thermal Conductivity of Insulating Layer)

The thermal conductivity of the insulating layer (core layer and skin layer) was measured by a laser flash method based on JIS R 1611. Table 1 shows the evaluation results.
(Thermal Resistance of Insulating Circuit Substrate)

The thermal resistance of the insulating circuit substrate was measured by a thermal transient measurement method based on JESD51. Table 1 shows the evaluation results.

TABLE 1

| | | Core layer (epoxy resin) | | | | Skin layer (polyimide resin) | | | | | Evaluation | | |
|---|---|---|---|---|---|---|---|---|---|---|---|---|---|
| | | Thick-ness (μm) | Inorganic filler | | Thermal conductivity (W/(mK)) | Thickness/Thermal conductivity | Thick-ness (μm) | Inorganic filler | | Thermal conductivity (W/(mk)) | Thickness/Thermal conductivity | Presence or absence of peeling after reflow treatment | Thermal conductivity of insulating layer (W/(mK)) | Heat resistance (K/W) |
| | | | Type | Content (vol %) | | | | Type | Content (vol %) | | | | | |
| Invention examples | 1 | 70 | Al₂O₃ | 80 | 7.0 | 10.0 | 3 | Al₂O₃ | 15 | 0.30 | 10.0 | Absence | 6.7 | 4.11 |
| | 2 | 70 | Al₂O₃ | 80 | 7.0 | 10.0 | 5 | Al₂O₃ | 30 | 0.50 | 10.0 | Absence | 6.4 | 4.10 |
| | 3 | 150 | Al₂O₃/BN | 90 | 15.0 | 10.0 | 3 | Al₂O₃ | 15 | 0.30 | 10.0 | Absence | 14.5 | 4.12 |
| | 4 | 150 | Al₂O₃/BN | 90 | 15.0 | 10.0 | 5 | Al₂O₃ | 30 | 0.50 | 10.0 | Absence | 14.3 | 4.10 |
| Comparative examples | 1 | 70 | Al₂O₃ | 80 | 7.0 | 10.0 | — | — | — | — | — | Presence | 7.0 | 4.10 |
| | 2 | 150 | Al₂O₃/BN | 90 | 15.0 | 10.0 | — | — | — | — | — | Presence | 15.0 | 4.11 |
| | 3 | 50 | BN | 60 | 0.9 | 55.6 | 5 | Al₂O₃ | 0 | 0.15 | 33.3 | Absence | 0.7 | 4.41 |
| | 4 | 150 | Al₂O₃/BN | 90 | 15.0 | 10.0 | 5 | Al₂O₃ | 0 | 0.15 | 33.3 | Absence | 13.9 | 4.31 |
| | 5 | 150 | Al₂O₃/BN | 90 | 15.0 | 10.0 | 5 | Al₂O₃ | 5 | 0.20 | 25.0 | Absence | 14.0 | 4.26 |
| | 6 | 150 | Al₂O₃/BN | 90 | 15.0 | 10.0 | 5 | Al₂O₃ | 40 | 0.80 | 6.3 | Presence | 14.7 | 4.06 |
| | 7 | 150 | Al₂O₃/BN | 90 | 15.0 | 10.0 | 5 | Al₂O₃ | 50 | 1.20 | 4.2 | Presence | 14.9 | 4.03 |

In Comparative Examples 1 and 2, in which the insulating layer was a single-layer structure of epoxy resin, peeling was observed after the reflow treatment due to an insufficient bonding property between the insulating layer and the metal plate.

In Comparative Examples 3 and 4, in which the polyimide resin forming the skin layer did not contain an inorganic filler, the thermal conduction property of the skin layer was low and the thermal resistance was high.

In Comparative Example 5 in which the amount of the inorganic filler in the polyimide resin forming the skin layer was smaller than the range of the present invention, the thermal conduction property in the skin layer was low and the thermal resistance was high.

In Comparative Examples 6 and 7, in which the amount of the inorganic filler in the polyimide resin forming the skin layer was higher than the range of the present invention, peeling was observed after the reflow treatment due to an insufficient bonding property between the insulating layer and the metal plate.

On the other hand, in Examples 1 to 4 of the present invention in which the insulating layer had a multi-layer structure having a core layer formed of an epoxy resin containing an inorganic filler and a skin layer formed of a polyimide resin containing an inorganic filler, and the amount of the inorganic filler in the epoxy resin forming the core layer and the amount of the inorganic filler in the polyimide resin forming the skin layer were in the ranges of the present invention, no peeling was observed after the reflow treatment and the bonding reliability was excellent. In addition, the thermal resistance was sufficiently low and the heat dissipation characteristics were excellent.

From the above, according to the Invention Examples, it was confirmed that it is possible to provide an insulating circuit substrate having excellent bonding reliability and excellent heat dissipation characteristics, and a method for manufacturing this insulating circuit substrate.

INDUSTRIAL APPLICABILITY

According to the present invention, it is possible to provide an insulating circuit substrate having excellent bonding reliability and excellent heat dissipation characteristics, and a method for manufacturing this insulating circuit substrate.

REFERENCE SIGNS LIST

10, 110 Insulating circuit substrate
11 Insulating layer
12 Core layer
13 Skin layer
15 Circuit layer
16 Metal layer
22 Epoxy resin composition
23 Polyimide resin composition
25 Metal piece (metal plate)
26 Metal plate

What is claimed is:
1. An insulating circuit substrate comprising:
an insulating layer; and
a circuit layer formed on one surface of the insulating layer,
wherein the insulating layer has a core layer formed of an epoxy resin containing an inorganic filler, and a skin layer formed of a polyimide resin containing an inorganic filler and formed on the circuit layer side of the core layer,
the inorganic filler in the epoxy resin is made of Al₂O₃, BN or AlN, or a mixture thereof,
an amount of the inorganic filler in the epoxy resin forming the core layer is in a range of 80 vol % or more and 95 vol % or less,
an amount of the inorganic filler in the polyimide resin forming the skin layer is in a range of 10 vol % or more and 30 vol % or less,
a ratio of the thickness of the skin layer to a thickness of the core layer is 0.020 to 0.071, and
a thickness of the skin layer is 3 μm to 5 μm.
2. The insulating circuit substrate according to claim 1, wherein a metal layer is formed on a surface of the insulating layer on an opposite side to the circuit layer, and a skin layer formed of a polyimide resin is formed on the metal layer side of the core layer.

3. A method for manufacturing an insulating circuit substrate by which the insulating circuit substrate according to claim 1 is manufactured, the method comprising:
- a core layer forming step of forming a core layer by curing an epoxy resin composition including an inorganic filler and an epoxy resin;
- a polyimide resin composition providing step of providing a polyimide resin composition including an inorganic filler and a polyimide resin on a surface of the core layer;
- a metal plate laminating step of laminating a metal plate to be a circuit layer on the polyimide resin composition; and
- a thermocompression bonding step of pressing and heating the metal plate, the polyimide resin composition, and the core layer in a laminating direction, curing the polyimide resin composition to form a skin layer, and bonding the metal plate and the insulating layer to form the circuit layer.

4. A method for manufacturing an insulating circuit substrate by which the insulating circuit substrate according to claim 1 is manufactured, the method comprising:
- a polyimide resin composition providing step of providing a polyimide resin composition including an inorganic filler and the polyimide resin, on a metal plate to be the circuit layer;
- an epoxy resin composition laminating step of laminating an epoxy resin composition including an inorganic filler and an epoxy resin on the polyimide resin composition; and
- a thermocompression bonding step of pressing and heating the metal plate, the polyimide resin composition, and the epoxy resin composition in a laminating direction, curing the polyimide resin composition to form a skin layer, curing the epoxy resin composition to form the core layer, and bonding the metal plate and the insulating layer to form the circuit layer.

5. The insulating circuit substrate according to claim 1, wherein the inorganic filler in the polyamide resin is made of $Al_2O_3$, BN or AlN, or a mixture thereof.

6. The insulating circuit substrate according to claim 1, wherein a lower limit of the amount of inorganic filler in the epoxy resin is 85 vol %.

7. The insulating circuit substrate according to claim 1, wherein a lower limit of the amount of inorganic filler in the epoxy resin is 90 vol %.

8. The insulating circuit substrate according to claim 1, wherein an upper limit of the amount of inorganic filler in the polyimide resin is 25 vol %.

9. A method for manufacturing an insulating circuit substrate by which the insulating circuit substrate according to claim 2 is manufactured, the method comprising:
- a core layer forming step of forming a core layer by curing an epoxy resin composition including an inorganic filler and an epoxy resin;
- a polyimide resin composition providing step of providing a polyimide resin composition including an inorganic filler and a polyimide resin on a surface of the core layer;
- a metal plate laminating step of laminating a metal plate to be a circuit layer on the polyimide resin composition; and
- a thermocompression bonding step of pressing and heating the metal plate, the polyimide resin composition, and the core layer in a laminating direction, curing the polyimide resin composition to form a skin layer, and bonding the metal plate and the insulating layer to form the circuit layer.

10. A method for manufacturing an insulating circuit substrate by which the insulating circuit substrate according to claim 2 is manufactured, the method comprising:
- a polyimide resin composition providing step of providing a polyimide resin composition including an inorganic filler and the polyimide resin, on a metal plate to be the circuit layer;
- an epoxy resin composition laminating step of laminating an epoxy resin composition including an inorganic filler and an epoxy resin on the polyimide resin composition; and
- a thermocompression bonding step of pressing and heating the metal plate, the polyimide resin composition, and the epoxy resin composition in a laminating direction, curing the polyimide resin composition to form a skin layer, curing the epoxy resin composition to form the core layer, and bonding the metal plate and the insulating layer to form the circuit layer.

11. The method for manufacturing an insulating circuit substrate according to claim 3, further comprising:
- a circuit pattern forming step of forming a circuit pattern by etching the metal plate to be the circuit layer after the thermocompression bonding step.

12. The method for manufacturing an insulating circuit substrate according to claim 3,
wherein a plurality of metal pieces provided in a circuit pattern are used as the metal plate and, in the thermocompression bonding step, a pressing member is disposed in a region, in which the metal pieces are not provided, and pressed.

13. The method for manufacturing an insulating circuit substrate according to claim 4, further comprising:
- a circuit pattern forming step of forming a circuit pattern by etching the metal plate to be the circuit layer after the thermocompression bonding step.

14. The method for manufacturing an insulating circuit substrate according to claim 4,
wherein a plurality of metal pieces provided in a circuit pattern are used as the metal plate and, in the thermocompression bonding step, a pressing member is disposed in a region, in which the metal pieces are not provided, and pressed.

15. The method for manufacturing an insulating circuit substrate according to claim 9, further comprising:
- a circuit pattern forming step of forming a circuit pattern by etching the metal plate to be the circuit layer after the thermocompression bonding step.

16. The method for manufacturing an insulating circuit substrate according to claim 9,
wherein a plurality of metal pieces provided in a circuit pattern are used as the metal plate and, in the thermocompression bonding step, a pressing member is disposed in a region, in which the metal pieces are not provided, and pressed.

17. The method for manufacturing an insulating circuit substrate according to claim 10, further comprising:
- a circuit pattern forming step of forming a circuit pattern by etching the metal plate to be the circuit layer after the thermocompression bonding step.

18. The method for manufacturing an insulating circuit substrate according to claim 10,
wherein a plurality of metal pieces provided in a circuit pattern are used as the metal plate and, in the thermocompression bonding step, a pressing member is disposed in a region, in which the metal pieces are not provided, and pressed.

19. An insulating circuit substrate for a power module, an LED module or a thermoelectric module, the insulating circuit substrate comprising:
an insulating layer;
a circuit layer formed on one surface of the insulating layer; and
a heat sink,
wherein the insulating layer has a core layer formed of an epoxy resin containing an inorganic filler, and a first skin layer formed of a polyimide resin containing an inorganic filler and formed on the circuit layer side of the core layer,
the inorganic filler in the epoxy resin is made of $Al_2O_3$, BN or AlN, or a mixture thereof,
an amount of the inorganic filler in the epoxy resin forming the core layer is in a range of 80 vol % or more and 95 vol % or less,
the circuit layer is configured for a power semiconductor element, an LED element or a thermoelectric element to be mounted on,
a metal layer is formed on a surface of the insulating layer on an opposite side to the circuit layer, and a second skin layer formed of a polyimide resin is formed on the metal layer side of the core layer,
the heat sink is bonded to the metal layer,
amounts of the inorganic filler in the polyimide resin forming the first and second skin layers are in a range of 10 vol % or more and 30 vol % or less,
thicknesses of the first and second skin layers are 3 μm to 5 μm,
a ratio of the thickness of the first skin layer to a thickness of the core layer is 0.020 to 0.071 and a ratio of the thickness of the second skin layer to a thickness of the core layer is 0.020 to 0.071,
a thickness of the circuit layer is in a range of 0.3 mm or more and 3 mm or less, and
the insulating circuit substrate is manufactured by thermo-compressing: metal pieces to be the circuit layer; a polyimide resin composition to be the first skin layer; the core layer; a polyimide resin composition to be the second skin layer; and a metal layer plate to be the metal layer, in an order, and by bonding the heat sink to the metal layer after thermo-compressing.

\* \* \* \* \*